(12) United States Patent
Aggarwal

(10) Patent No.: US 7,826,549 B1
(45) Date of Patent: Nov. 2, 2010

(54) WIRELESS COMMUNICATION TRANSMITTER AND SYSTEM HAVING THE SAME

(75) Inventor: Sudhir Aggarwal, 273 Saint Henry Dr., Fremont, CA (US) 94539

(73) Assignee: Sudhir Aggarwal, Fremont, CA (US)

( * ) Notice: Subject to any disclaimer, the term of this patent is extended or adjusted under 35 U.S.C. 154(b) by 829 days.

(21) Appl. No.: 11/592,862

(22) Filed: Nov. 2, 2006

(51) Int. Cl.
*H03C 1/52* (2006.01)
*H04L 27/02* (2006.01)

(52) U.S. Cl. ............... 375/270; 375/301; 332/170

(58) Field of Classification Search .......... 332/103, 332/105, 170; 375/269–270, 298, 295, 300–301
See application file for complete search history.

(56) References Cited

U.S. PATENT DOCUMENTS

| | | | |
|---|---|---|---|
| 4,130,802 A | 12/1978 | Nossen et al. | |
| 4,973,977 A * | 11/1990 | Hawkins et al. | 341/144 |
| 6,339,621 B1 * | 1/2002 | Cojocaru et al. | 375/247 |
| 6,483,355 B1 | 11/2002 | Lee et al. | |
| 7,523,153 B2 | 4/2009 | Goyal | |
| 2004/0125632 A1 | 7/2004 | Regev et al. | |
| 2005/0179423 A1 | 8/2005 | Xing | |
| 2005/0239417 A1 | 10/2005 | Boos | |
| 2006/0226903 A1 | 10/2006 | Muller et al. | |
| 2006/0291589 A1 * | 12/2006 | Eliezer et al. | 375/302 |
| 2007/0035337 A1 | 2/2007 | Kim et al. | |
| 2007/0069764 A1 * | 3/2007 | Lewis et al. | 326/38 |
| 2007/0116104 A1 | 5/2007 | Fujiwara et al. | |
| 2007/0194924 A1 | 8/2007 | Karr | |
| 2008/0291971 A1 | 11/2008 | Chin Po Shin et al. | |

* cited by examiner

*Primary Examiner*—David C Payne
*Assistant Examiner*—James M Perez
(74) *Attorney, Agent, or Firm*—Blakely, Sokoloff, Taylor & Zafman LLP

(57) ABSTRACT

A method and apparatus is disclosed herein for transmitting data wirelessly. In one embodiment, the transmitter comprises a first group of stages comprising a first plurality of XOR gates and a first plurality of transistors, each XOR gate of the first plurality of XOR gates having a pair of inputs coupled to one bit of a first set data bits and a first clock, both corresponding to a I quadrature baseband signal component, and having a first output coupled to drive one of the first plurality of transistors; a group plurality of stages comprising a second plurality of XOR gates and a second plurality of transistors, each XOR gate of the second plurality of XOR gates having a pair of inputs coupled to one bit of a second set of data bits and a second clock, both corresponding to a Q quadrature baseband signal component, and having a second output coupled to drive one of the second plurality of transistors, wherein the outputs of the first and second plurality of transistors are summed at a node to obtain a single-side band (SSB) RF output.

16 Claims, 6 Drawing Sheets

WIRELESS COMMUNICATION TRANSMITTER AND SYSTEM HAVING THE SAME

FIELD OF THE INVENTION

The present invention is related to the field of wireless communication systems such as, for example, but not limited to, cellular systems, wireless local area networking (WLAN), Zigbee, RF ID, ultra-wide band (UWB), MiMO, Wi-Fi, WiMax applications; more specifically, the present invention is related to a transmitter that transmits digital base-band data using a quadrature amplitude modulation (QAM) RF carrier.

BACKGROUND OF THE INVENTION

In wireless communication systems, quadrature amplitude modulation is used for transmitting the radio frequency (RF) signal. In most of the wireless systems, the information bearing base-band signal is in a digital format. The base-band signal is converted to analog form by using a digital-to-analog (DAC) converter. This analog signal is up-converted by modulating a high frequency carrier to make it suitable for transmission. The DAC and up-converter are the power and silicon-area consuming blocks in a typical transmitter. The complex design of these blocks is very time consuming, resulting in a high design cost. Design complexity, power consumption and silicon-area are the important factors in mobile wireless applications for determining the cost.

FIG. 1 is a block diagram of a typical transmitter used in a radio-frequency (RF) transceiver chip of wireless communication systems. Referring to FIG. 1, the information bearing baseband signal is a digital signal having 'I' and 'Q' components, which are referred to herein as I-data and Q-data, respectively. The I-data and Q-data, each having N bits (where N can be in the range of 1 to 20), are normally generated by a digital baseband signal processor. In the RF transceiver chip, the I-data and Q-data of the base-band digital signal are converted to analog form by using digital-to-analog (DAC) converters 101 and 102, respectively. The outputs of DACs 101 and 102 are filtered with filters 103 and 104, respectively, to remove out-of-band components introduced by DACs 101 and 102. Thereafter, the analog signals output from I filter 103 and Q filter 104 are fed into variable gain amplifiers (VGAs) 105 and 106, respectively, and then up-converted to a high frequency suitable for transmission by modulating a carrier frequency.

Many of the systems modulate the carrier as quadrature amplitude modulation (QAM) using a single-side band (SSB) mixer that is an analog RF block. In FIG. 1, a pair of mixers 107 and 108 is used. Mixer 107 up-converts the analog I-data, which has been filtered and amplified, using an I-clock output from divider 109. Mixer 108 up-converts the analog Q-data, which has been filtered and amplified, using a Q-clock output from divider 109. Divider 109 generates I-clock and Q-clock from a clock signal from oscillator 110 by dividing the frequency by two. Thus, generated I and Q clocks have half the frequency of the oscillator and they differ in phase by 90 degrees. The outputs of mixers 107 and 108 are combined using adder 111 that operates as a combiner to provide the SSB output. The output of adder 111 is amplified by RF driver amplifier (RF PA) 112. In low power systems such as UWB, Zigbee, RF IDs, usually, RF PA 112 is the final stage providing RF output for transmission. However, in the cellular and WLAN systems, the RF PA 112 act as pre-driver and provides output to an external power amplifier. A bandpass filter (BPF) 113 filters the output of amplifier 112. The signal output from BPF 113 is then transmitted using antenna 114.

Recently, another approach has been used to replace the analog up-conversion mixer and pre-driver in cellular applications such as GSM/EDGE. The quadrature baseband signal components 'I' and 'Q' are converted to polar signal having amplitude 'A' and phase 'ϕ'. FIG. 2 illustrates a digital power amplifier user for amplitude modulation. Referring to FIG. 2, the amplitude part of the signal is used for amplitude modulation of the carrier using a digital power amplifier. In this case, a digital controlled oscillator (DCO) 201 generates the clock having frequency equal to the carrier frequency. The digital amplitude data bits 202 are used in digital 'AND' operation with AND gates 203 with the clock from DCO 201. This portion acts as RF DAC. The outputs of AND gates 203 drive the power amplifier transistors 204 that generates the required amplitude modulated output, which is coupled to an external power amplifier 206 and antenna 207 via a matching network 205. The amplitude modulated signal has undesired components also. The dominant one is the carrier itself that needs to be suppressed, and other out of band frequencies components exist in the prohibited band. A typical output power spectrum of such a transmitter is shown in FIG. 5. Referring to FIG. 5, the carrier has high amplitude and there are components at multiple of the carrier frequency. To avoid the out-of-band signal components, various schemes are used such as one described in a U.S. patent application publication no. 20060119493. These techniques increase the transmitter complexity. Moreover, for transmission, the lack of a single-side band output usually results in increase of power usage.

SUMMARY OF THE INVENTION

A method and apparatus is disclosed herein for transmitting data wirelessly. In one embodiment, the transmitter comprises a first group of stages comprising a first plurality of XOR gates and a first plurality of transistors, each XOR gate of the first plurality of XOR gates having a pair of inputs coupled to one bit of a first set data bits and a first clock, both corresponding to a I quadrature baseband signal component, and having a first output coupled to drive one of the first plurality of transistors; a group plurality of stages comprising a second plurality of XOR gates and a second plurality of transistors, each XOR gate of the second plurality of XOR gates having a pair of inputs coupled to one bit of a second set of data bits and a second clock, both corresponding to a Q quadrature baseband signal component, and having a second output coupled to drive one of the second plurality of transistors, wherein the outputs of the first and second plurality of transistors are summed at a node to obtain a single-side band (SSB) RF output.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1:
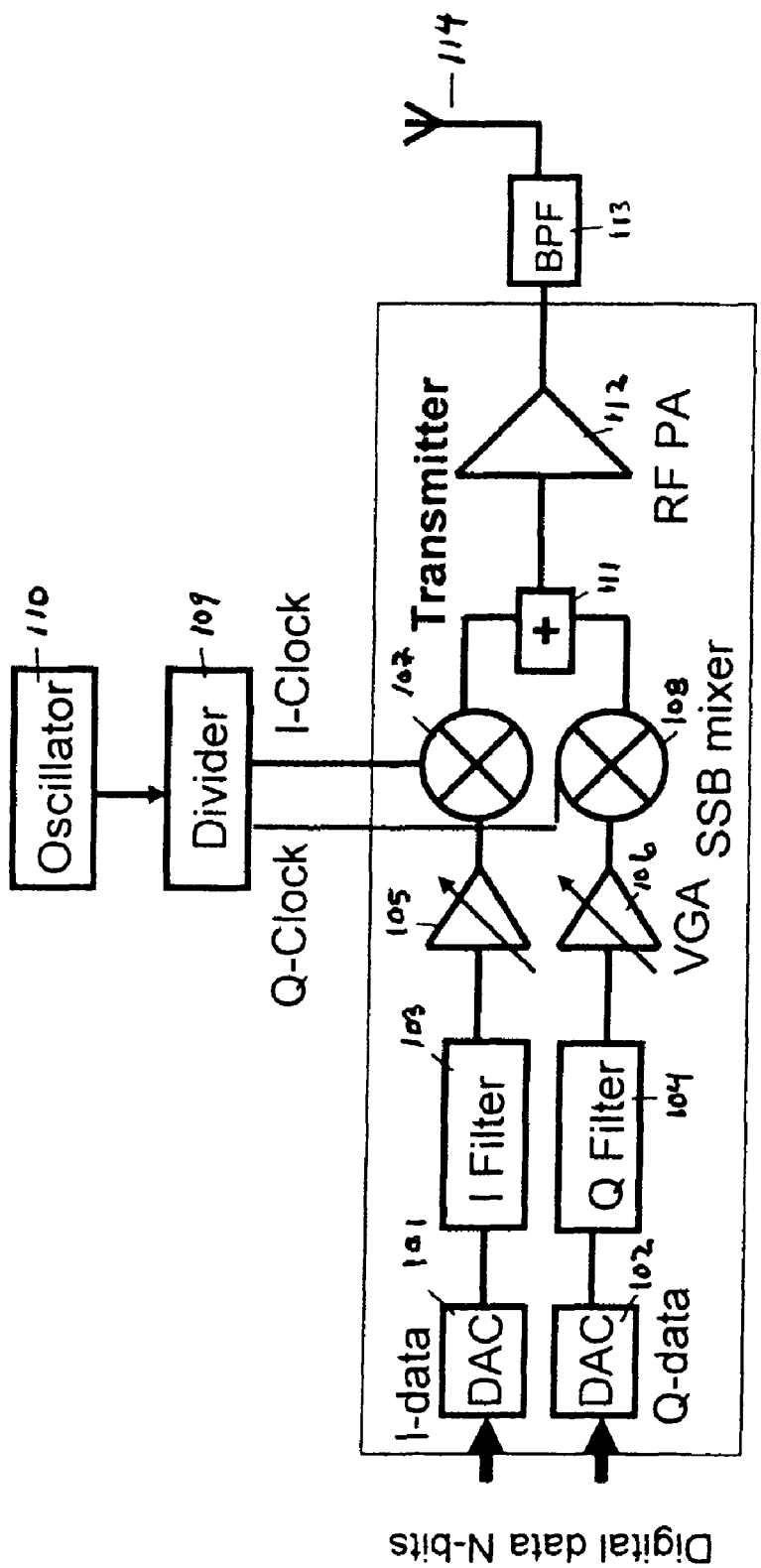
FIG. 1 is a block diagram of a typical transmitter used in a radio-frequency (RF) transceiver chip of wireless communication systems.

A transmitter and wireless communication device for using the same are described. In one embodiment, the transmit section of a wireless communication system performs a digital power amplifier function, performs a digital-to-analog conversion, and has variable gain and up-conversion functionality built into it. Therefore, most of the complex analog blocks are replaced by simple digital circuits. The digital circuit do not consume any static power. Therefore, the DAC, up-conversion and amplification in one block all together results in considerable saving in the silicon-area and power. Digital circuit are simpler to design and design migration to newer technologies is easy.

In one embodiment, the transmitter is compact, thereby saving a lot of power consumption and silicon-area. Also, it results in a simplification of the design by replacing analog blocks by digital circuitry thus reducing design time. Therefore, the device will be more cost-effective and suitable for use in the mobile applications where battery power is a major concern.

In one embodiment, the carrier frequency can be easily changed by changing the clock frequency. This feature makes the transmitter suitable for software defined radio (SDR) where it can be configured for various applications.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

An Example of a Transmitter

In one embodiment, the transmitter described herein performs quadrature amplitude modulation to generate a single-side band (SSB) signal for RF transmission.

In one embodiment, the radio frequency (RF) transmitter comprises two groups of stages. The first group of stages includes a first set of XOR gates and a first set of transistors, where each XOR gate has one input coupled to one of the I quadrature baseband signal component bits (I-data) and another input coupled to the clock corresponding to the I quadrature baseband signal component (i.e., the I-clock). The output of each XOR gate in the first set coupled to drive one of the first set of transistors. The second group of stages includes a second set of XOR gates and a second set of transistors, where each XOR gate has one input coupled to one of the Q quadrature baseband signal component bits (Q-data) and another input coupled to the clock corresponding to the Q quadrature baseband signal component (i.e., the Q-clock). The output of each XOR gate in the second set coupled to drive one of the second set of transistors. The outputs of the first and second sets of transistors are summed at a node to obtain a single-side band (SSB) RF output. In one embodiment, the transmitter also includes an inductor load coupled to the node.

In one embodiment, the sizes of transistors in the first and second sets of transistors vary among each other. In one embodiment, each of the transistors of the first and second sets have an area that is proportional to weight of the data bits corresponding to the I and Q quadrature baseband signal components.

In one embodiment, the clock frequency of the I and Q clocks corresponding to the I and Q quadrature baseband signal components are variable, and setting the I and Q clocks sets the carrier frequency.

Figure 3:
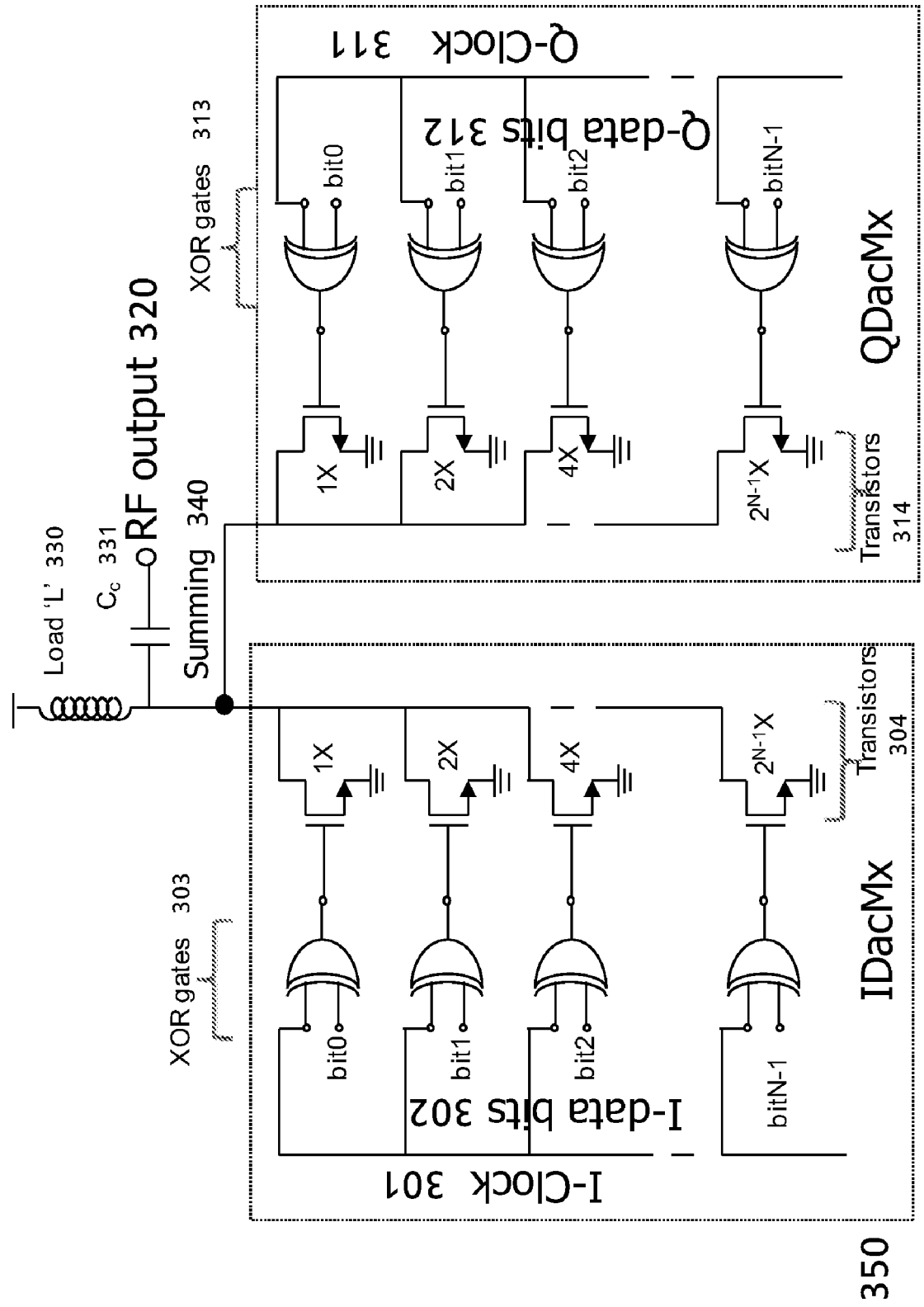
FIG. 3 is a circuit schematic of one embodiment of a transmitter.

FIG. 3 is a circuit schematic of one embodiment of a transmitter. In one embodiment, the baseband data in quadrature format, i.e. I and Q, are used directly without conversion to the polar format. In one embodiment, the baseband data in quadrature format is generated by a digital baseband signal processor (not shown to avoid obscuring the present invention). The clock having frequency equal to the carrier frequency has also an in-phase component (I-clock) and a quadrature component (Q-clock). The quadrature clock, Q-clock, is 90 degree phase shifted with respect to the in-phase clock, I-clock. Methods for generating the clocks are well known in the literature, with a more common one being the use of a divide-by-two circuit that provides the required clock components.

Referring to FIG. 3, there is an IDacMx block 350 and a QDacMx block 351. In IDacMx block 350, each of N (corresponding to N bits) XOR gates 303 has a pair of inputs. One input is coupled to I-clock 301 and the other input is coupled to one of N-bits of I-data bits 302. In one embodiment, I-clock 301 is an output of a divider that divides the clock signal generated by an oscillator (e.g., a digitally controller oscillator). The output of each of XOR gates 303 is coupled to a gate of one of MOS transistors 304 to drive the respective MOS transistor. In one embodiment, the drain and source of each of MOS transistors 304 are coupled to summing node 340 and ground, respectively. In QDacMx block 351, each of N (corresponding to N bits) XOR gates 313 has a pair of inputs. One input is coupled to Q-clock 311 and the other input is coupled to one of N-bits of Q-data bits 312. In one embodiment, Q-clock 311 is an output of a divider that divides the clock signal generated by an oscillator (e.g., a digitally controller oscillator). The output of each of XOR gates 313 is coupled to a gate of one of MOS transistors 314 to drive the respective MOS transistor. In one embodiment, the drain and source of each of MOS transistors 314 are coupled to summing node 340 and ground, respectively. Note that each set of N XOR gates and the corresponding transistors that it drives IDacMx block 350 and a QDacMx block 351 may be considered a stage of the variable gain amplifier.

In operation, data components of I-data bits 302 and Q-data bits 312 are digitally multiplied by their respective clocks by making them inputs of the XOR gates. In one embodiment, the MOS transistors are of varying sizes. In one embodiment, the MOS transistors have their areas proportional to the weight of the digital data bits. For example, the least significant bits (LSBs), big), of both I-data 302 and Q-data 312 are coupled to a transistor with half the area of the transistor for the next bit of both I-data 302 and Q-data 312, i.e. bit1. Similarly, bit1 of both I-data 302 and Q-data 312 are coupled to a transistor with half the area of the transistor for the next bit of both I-data 302 and Q-data 312, i.e. bit2. By making the transistor areas proportional to the weight of digital data bits, the digital-to-analog conversion is achieved.

In an alternative embodiment, one or more of transistors have an area that is not proportional to the weight of the data bits. In such a scheme, these one or more transistors have the same area. Such transistors can be used for correcting DC offset and mismatch between the I and Q branches. That is, by turning some of these transistors off or on, the DC offset or balance between the I and Q branches may be obtained.

In the 'standby' and 'off' states, the data bits and clock are set to 'zero' state, the output of XOR gates is zero and all driver transistor are off. Thus, there is no power dissipation in the standby and off-state. In one embodiment of a communication system, 'standby' and 'off' states are used as a reduced power consumption state.

Figure 2:
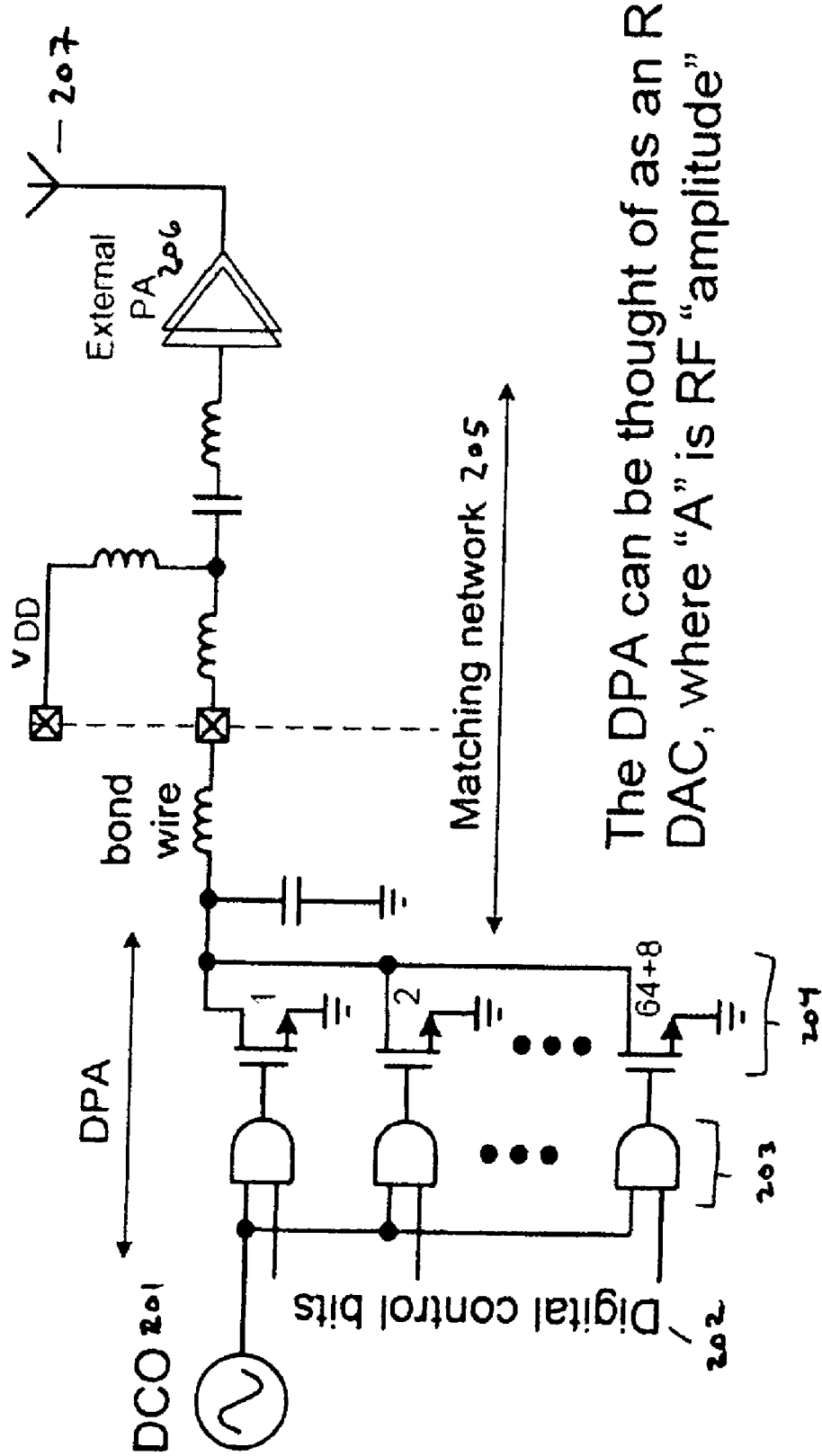
FIG. 2 illustrates a digital power amplifier user for amplitude modulation.

The inductive load circuit, which is a combination of inductor 330 and capacitor 331. summing the outputs of the XOR gates is capacitively coupled to provide the matched RF output 320. Methods for matching the output load for maximum power are well known in the literature, one of which is shown in FIG. 2.

By summing the output of I part and Q part, the transmitter generates a single-side band (SSB) RF output that can be used directly for transmission. In case of high power transmitters, this output can be fed to the external power amplifier. Also, the choice between the upper side-band and lower side-band can be easily made simply by reversing one of the clocks.

In one embodiment, the transmitter includes a controller to disable or enable the first group of XOR gates and its associated first set of transistors and the second group of XOR gates and its associated second set of transistors to adjust the gain. For implementing variable gain in this scheme, in one embodiment, the I part and Q-part, IDacMx block 350 and QDacMx block 351, are duplicated and their output summed at the same node having the inductor load.

Figure 4:
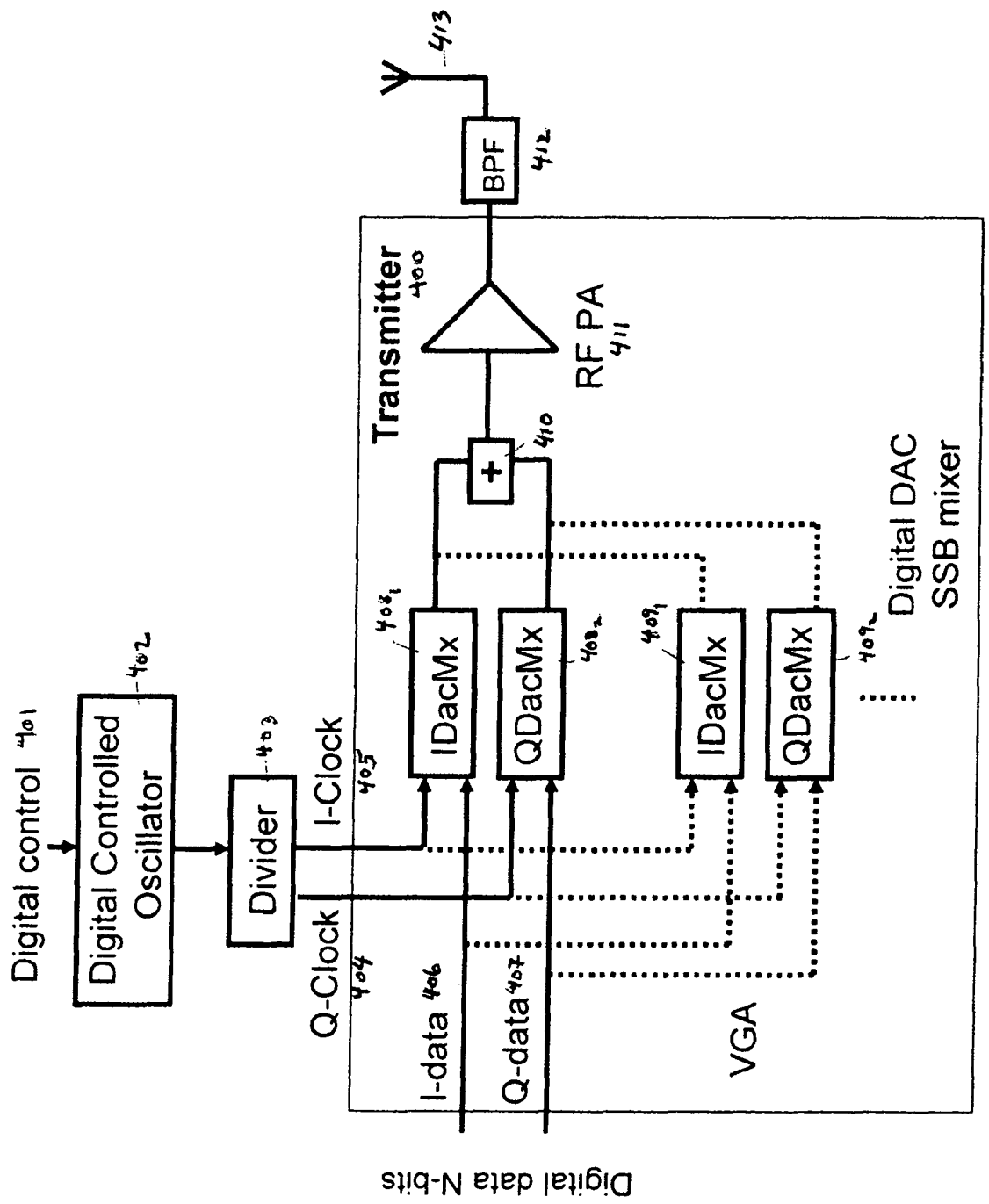
FIG. 4 is a schematic of one embodiment of a digital QAM SSB transmitter having a digital DAC, mixer and VGA.
Figure 5:
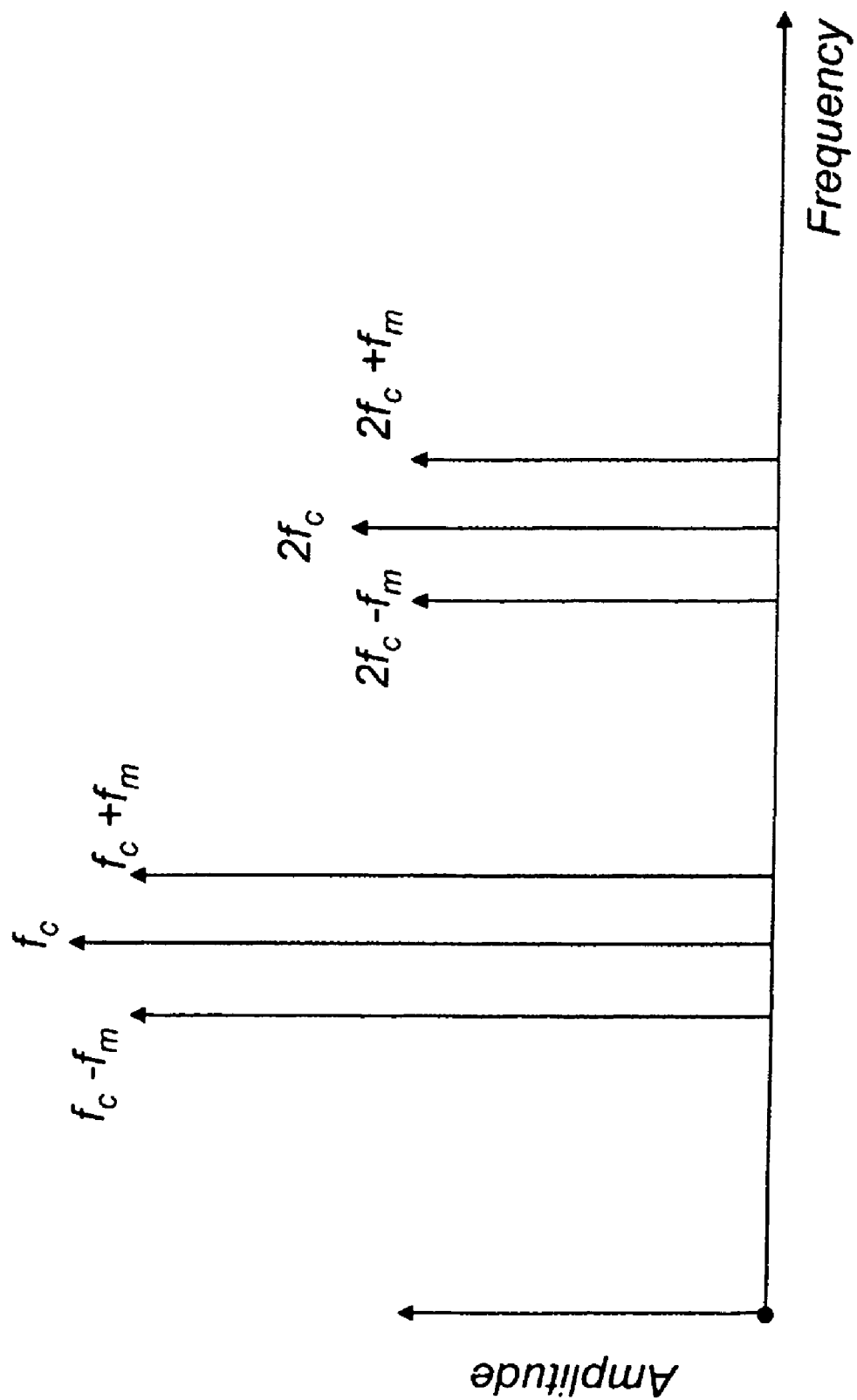
FIG. 5 illustrates a typical output power spectrum of a transmitter such as is shown in FIG. 2.

FIG. 4 is a schematic of one embodiment of a digital QAM SSB transmitter having a digital DAC, a mixer and a VGA. Referring to FIG. 4, transmitter 400 receives I-data 406 and Q-data 407, along with Q-clock 404 and I-clock 405. In one embodiment, I-data 406 and Q-data 407 are n-bits of digital data generated by a digital baseband signal processor. Q-clock 404 and I-clock 405 are output from divider 403 which receives a clock signal from digital controlled oscillator 402 responsive to digital control 401. Digital control 401 can be used to control the carrier frequency as described herein.

There are two or more stages shown, each having an IDacMx and QDacMx. For example, one stage includes IDacMx $408_1$ and QDacMx $408_2$, while another stage includes IDacMx $409_1$ and QDacMx $409_2$. Each stage receives the I-data 406 and Q-data 407, along with Q-clock 404 and I-clock 405 and generates the outputs as described above in conjunction with FIG. 3. With the two stages shown, in one embodiment, the total output would be double, thereby providing a gain of 6 dB. More such stages may be implemented if more gain range is required. In reverse, to reduce the gain, one such stage is switched off to reduce the gain by 6 dB. For gain step of less than 6-dB, the transistors of each of the IDacMx and QDacMx stages can be made of transistors having their sizes reduced by the same amount. Thus, if only 3-dB of gain is desired, the transistors of the IDacMx and QDacMx stages are reduced in size proportionally.

All the outputs from the stages are added together with adder 410. In one embodiment, this is performed by putting all the drains at one node. The output of adder 410 is amplified by amplifier 411 and then output from transmitter 400. The output from amplifier 411 is filtered using BPF 412 and transmitted using antenna 413.

Figure 6:
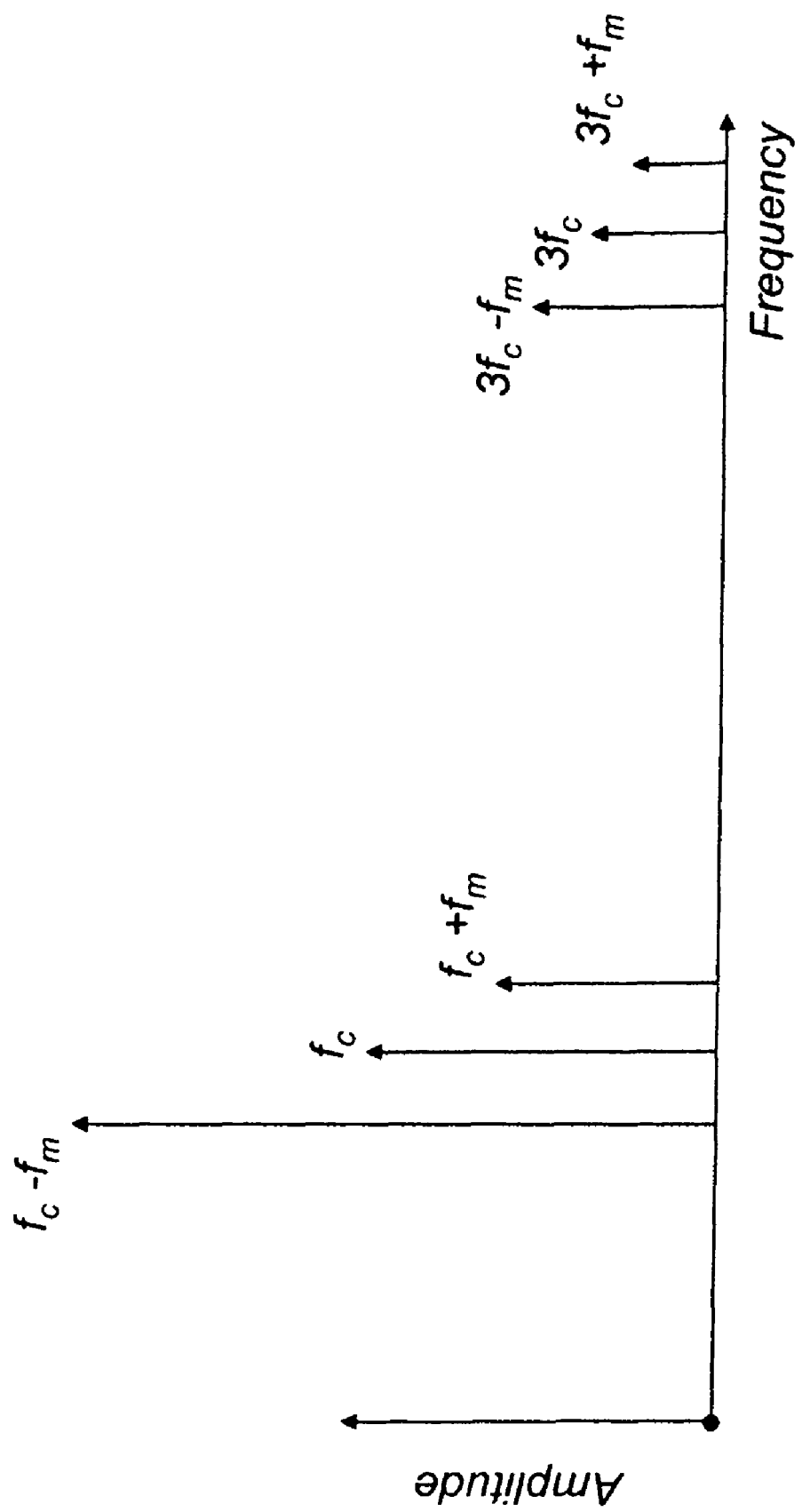
FIG. 6 illustrates the typical output spectrum from a transmitter such as shown in FIG. 3.

FIG. 6 illustrates the typical output spectrum from such a transmitter. As shown, the carrier is suppressed and the out-of-band components are at the odd multiples of the carrier frequency. Even the lowest harmonic i.e. the $3^{rd}$ harmonics is at high enough frequency and is very much suppressed. Therefore, a very simple filtering is required as compared to the existing approaches.

It can be observed that the carrier frequency can be easily changed by varying the clock frequency.

Therefore, this architecture of the transmitter is well suited for a software defined radio (SDR) that can implement various applications just by changing the clock controlled by software.

In summary, the transmitter described herein provides all the transmit functions i.e. DAC. VGA, up-converter mixer and pre-driver for power amplifier or power amplifier. Also, the transmitter provides the single-side band output that can be used for transmission. Another advantage is that it consumes no DC power when the data and clock are zero. As most the circuitry is digital, the design is very much simplified reducing the design-time.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

I claim:

1. A radio frequency (RF) transmitter comprising:
   a first plurality of XOR gates and a first plurality of transistors, each XOR gate of the first plurality of XOR gates having a pair of inputs coupled to one bit of a first set data bits and a first clock, both corresponding to a I quadrature baseband signal component, and having a first output coupled to drive one of the first plurality of transistors;
   a second plurality of XOR gates and a second plurality of transistors, each XOR gate of the second plurality of XOR gates having a pair of inputs coupled to one bit of a second set of data bits and a second clock, both corresponding to a Q quadrature baseband signal component, and having a second output coupled to drive one of the second plurality of transistors, wherein each of a first subset of the first plurality of transistors and a first subset of the second plurality of transistors have an area that is proportional to a weight of the corresponding data bit of the I or Q quadrature baseband signal component, and wherein each of a second subset of the first plurality of transistors and a second subset of the second plurality of transistors have an equal area;
   the outputs of the first and second plurality of transistors being summed at a node to obtain a single-side band (SSB) RF output; and
   a controller to disable or enable the first subset of the first plurality of transistors and the first subset of the second plurality of transistors to obtain digital-to-analog conversion of the I and Q quadrature baseband signal components and to disable or enable the second subset of the first plurality of transistors and the second subset of the second plurality of transistors to correct a DC offset between the I and Q quadrature baseband signal components.

2. The transmitter defined in claim 1 wherein clock frequency of the I and Q clocks corresponding to the I and Q quadrature baseband signal components are variable, and setting the I and Q clocks sets the carrier frequency.

3. The transmitter defined in claim 1 wherein further comprising load coupled to the node.

4. The transmitter defined in claim 1 wherein the controller is configured to adjust a gain of the transmitter.

5. The transmitter defined in claim 1 further comprising a power amplifier having an input coupled to the output.

6. The transmitter defined in claim 1 further comprising:
   a bandpass filter coupled to the output; and
   an antenna coupled to the bandpass filter.

7. The transmitter defined in claim 1 wherein the data bits of the quadrature baseband signal and their associated clocks are set to a predetermined state, the output of XOR gates of the first and second plurality of XOR gates are zero and transistors of the first and second sets of transistors are off to reduce power consumption.

8. A radio comprising:
   a direct-digital quadrature amplitude modulation (QAM) transmitter comprising
      a first plurality of stages comprising a first plurality of XOR gates and a first plurality of transistors, each XOR gate of the first plurality of XOR gates having a pair of inputs coupled to one bit of a first set data bits and a first clock, both corresponding to a I quadrature baseband signal component, and having a first output coupled to drive one of the first plurality of transistors,
      a second plurality of stages comprising a second plurality of XOR gates and a second plurality of transistors, each XOR gate of the second plurality of XOR gates having a pair of inputs coupled to one bit of a second set of data bits and a second clock, both corresponding to a Q quadrature baseband signal component, and having a second output coupled to drive one of the second plurality of transistors, the outputs of the first and second plurality of transistors being summed at a node to obtain a single-side band (SSB) RF output, wherein each of a first subset of the first plurality of transistors and a first subset of the second plurality of transistors have an area that is proportional to a weight of the corresponding data bit of the I or Q quadrature baseband signal component, and wherein each of a second subset of the first plurality of transistors and a second subset of the second plurality of transistors have an equal area;
   a controller to disable or enable the first subset of the first plurality of transistors and the first subset of the second plurality of transistors to obtain digital-to-analog conversion of the I and Q quadrature baseband signal components and to disable or enable the second subset of the first plurality of transistors and the second subset of the second plurality of transistors to correct a DC offset between the I and Q quadrature baseband signal components;
   a bandpass filter coupled to the SSB RF output; and
   an antenna coupled to the bandpass filter.

9. The radio defined in claim 8 wherein clock frequency of the I and Q clocks corresponding to the I and Q quadrature baseband signal components are variable, and setting the I and Q clocks sets the carrier frequency.

10. The radio defined in claim 8 wherein further comprising a load coupled to the node.

11. The radio defined in claim 8 wherein the controller is configured to adjust a gain.

12. The radio defined in claim 8 wherein the data bits of the quadrature baseband signal and their associated clocks are set to a predetermined state, the output of XOR gates of the first and second plurality of XOR gates are zero and transistors of the first and second sets of transistors are off to reduce power consumption.

13. A method comprising:
performing, by a first plurality of XOR gates, a first XOR operation on each bit of an I quadrature baseband signal component and a first clock signal;
performing, by a second plurality of XOR gates, a second XOR operation on each bit of a Q quadrature baseband signal component and a second clock signal;
driving a first plurality of transistors with outputs generated from performing the first XOR operations and driving a second plurality of transistors with outputs generated from performing the second XOR operations and summing the outputs of the first and second plurality of transistors to obtain a single-side band (SSB) RF output, wherein each of a first subset of the first plurality of transistors and a first subset of the second plurality of transistors have an area that is proportional to a weight of the corresponding data bit of the I or Q quadrature baseband signal component, and wherein each of a second subset of the first plurality of transistors and a second subset of the second plurality of transistors have an equal area; and
enabling or disabling the first subset of the first plurality of transistors and the first subset of the second plurality of transistors to obtain digital-to-analog conversion of the I and Q quadrature baseband signal components and disabling or enabling the second subset of the first plurality of transistors and the second subset of the second plurality of transistors to correct a DC offset between the I and Q quadrature baseband signal components.

14. The method defined in claim 13 further comprising:
setting and modifying the carrier frequency by setting the clock frequency.

15. The method defined in claim 13 wherein the first clock signal and the second clock signal are the I and Q clocks, respectively.

16. The method defined in claim 13 further comprising reducing power consumption by setting the data bits of the I and Q quadrature baseband signal components and the first and second clock signals to a predetermined state, causing the outputs of the XOR operations to be zero.

* * * * *